(12) United States Patent
Tokarz et al.

(10) Patent No.: US 11,962,151 B2
(45) Date of Patent: Apr. 16, 2024

(54) SYSTEM FOR CONTROLLING POWER TO LOAD FROM POWER SUPPLY LINE

(71) Applicant: APTIV TECHNOLOGIES LIMITED, St. Michael (BB)

(72) Inventors: Krzysztof Tokarz, Lapczyca (PL); Guillaume Tournabien, Saint Soupplets (FR)

(73) Assignee: APTIV TECHNOLOGIES AG, Schaffhausen (CH)

( * ) Notice: Subject to any disclaimer, the term of this patent is extended or adjusted under 35 U.S.C. 154(b) by 0 days.

(21) Appl. No.: 18/120,493

(22) Filed: Mar. 13, 2023

(65) Prior Publication Data
US 2023/0318293 A1  Oct. 5, 2023

(30) Foreign Application Priority Data

Mar. 31, 2022  (EP) ...................................... 22165920

(51) Int. Cl.
*H02J 3/00* (2006.01)
*B60R 16/033* (2006.01)

(52) U.S. Cl.
CPC .......... *H02J 3/0073* (2020.01); *B60R 16/033* (2013.01); *H02J 3/0012* (2020.01)

(58) Field of Classification Search
CPC ...... H02J 3/0073; H02J 3/0012; B60R 16/033
USPC ....................................................... 307/9.1
See application file for complete search history.

(56) References Cited

U.S. PATENT DOCUMENTS

| 8,476,939 B1 * | 7/2013 | Candage ............. H03K 17/164 |
| | | 327/404 |
| 8,598,840 B2 | 12/2013 | Yount et al. |
| 9,423,817 B2 | 8/2016 | Sakakibara |
| 9,529,016 B2 | 12/2016 | Aerts |

(Continued)

FOREIGN PATENT DOCUMENTS

| CN | 112379253 A | 2/2021 |
| CN | 113555848 A | 10/2021 |

(Continued)

OTHER PUBLICATIONS

Extended European Search Report issued by the European Patent Office in connection with International Application No. 22165920. 4, dated Oct. 19, 2022.

*Primary Examiner* — Richard Tan
(74) *Attorney, Agent, or Firm* — Carter, DeLuca & Farrell, LLP; George Likourezos

(57) ABSTRACT

A system for controlling power supply to a load from a power supply line including a first circuit, at least a second circuit, a control module, and a monitoring module. The first circuit includes a first path for supplying power to the load, and a first switching mechanism for controlling the supply of power through the first path. The second circuit includes a second path for supplying power to the load and a second switching mechanism for controlling the supply of power through the second path. The control module is configured to output control signals to control operations of the circuits to independently switch on or off each of the respective paths. The monitoring module is configured to monitor physical quantity parameters of the paths, to detect deviations of the physical quantity parameter values from respective reference values to check the consistency between the first and second path.

11 Claims, 3 Drawing Sheets

(56) References Cited

U.S. PATENT DOCUMENTS

| | | |
|---|---|---|
| 10,071,762 B2 | 9/2018 | Skellenger |
| 10,840,700 B2 | 11/2020 | Illing et al. |
| 2021/0122244 A1 | 4/2021 | Nakamura |
| 2022/0082606 A1 | 3/2022 | Saito |

FOREIGN PATENT DOCUMENTS

| | | | |
|---|---|---|---|
| EP | 3754347 A1 | | 12/2020 |
| EP | 3767316 A1 | | 1/2021 |
| EP | 3923432 A1 | | 12/2021 |
| JP | 2019066364 | * | 4/2019 |

* cited by examiner

SYSTEM FOR CONTROLLING POWER TO LOAD FROM POWER SUPPLY LINE

CROSS-REFERENCE TO RELATED APPLICATION

This application claims the benefit of European patent application serial number EP 22165920.4 filed on Mar. 31, 2022. The entire contents of which are hereby incorporated by reference herein.

TECHNICAL FIELD

The present disclosure relates to the field of controlling power to a load from a power supply line. Such a system can be used to supply power to a load in a vehicle.

BACKGROUND

In the automotive field, the management of energy distribution within a vehicle has become more and more important. Furthermore, the development of systems for driving safety or autonomous driving requires to avoid as much as possible failures in power supply lines for supplying systems having critical functions, referenced as safety loads. New regulations require certain critical functions to be available as long as possible in the vehicle, while other functions can be disabled to offer more lifetime to these critical functions. For example, in case of loss of a power source, a braking and steering system must be maintained ON, while a rear defrost system must be switched OFF. The purpose of such measures is to ensure that the vehicle has enough time to be parked in a safe area, in case of failure.

To drive a load in a vehicle, it is well known to place a driving circuit including a switching mechanism between the power supply line and the load, in a high-side driver configuration, or between the load and the ground, in a low-side driver configuration. The switching mechanism is configured to switch on or off the load path for supplying power to the load. It may comprise one or more transistors, for example MOSFETs.

Different solutions exist to ensure that the load is properly driven.

For example, a known solution for detecting malfunctions is to provide the driving circuit with a diagnostic module configured to detect some standard malfunctions such as a broken component, disconnection of the load, or a load consuming too much current. However, such a standard diagnostic module only allows the detection of a limited number of standard damages.

Other known solutions involve to use multiple modules to power the safety loads in the vehicle. However, such solutions are very expensive in terms of cost and area overhead.

So, there is a need to provide a more efficient solution for detecting and/or predicting a degradation of the power supplying module to ensure that the load is properly driven.

SUMMARY

The present disclosure concerns a system for controlling power supply to a load from a power supply line, the system comprising:
a first circuit comprising a first path for supplying power to the load and a first switching mechanism for controlling the supply of power through the first path;
at least a second circuit comprising a second path for supplying power to the load and a second switching mechanism for controlling the supply of power through the second path;
a control module configured to output control signals to control operations of the first circuit and the at least second circuit so as to independently switch on or off each of the first and at least second paths; and
a monitoring module configured to monitor one or more physical quantity parameters of the first and at least second paths,
wherein the monitoring module is configured to detect, based on a comparison, deviations of the monitored one or more physical quantity parameter values from respective reference values, so as to check the consistency between the first and at least second path.

The present disclosure provides a solution for detecting and/or predicting a degradation of physical parameters of the circuits for supplying power to the load to ensure that the load is properly driven.

According to the present disclosure, values of one or more physical quantity parameters of the first and at least second paths for supplying power to the load are monitored. A comparison is then performed, using acquired values of the one or more physical quantity parameters. Based on this comparison, deviations of the monitored one or more physical quantity parameters from respective reference values can be detected so as to check the consistency between the first and at least second path. This allows to detect deviations related to any kind of element, that are indicative of a potential default or degradation. The comparison involves the first and at least second paths and is not affected by external factors such as temperature, humidity, voltage, etc. because the first and at least second paths are affected in the same way.

In an embodiment, the first and at least second circuits are connected in parallel between a load connection node and a power supply line node.

The first and at least second circuits may have a same electric structure.

In an embodiment, each of the first and at least second circuits includes one or more detection devices configured to measure the one or more physical quantity parameters, and
the one or more physical quantity parameters are from the group including current, voltage, and temperature.

In an embodiment, the monitoring module is configured to
acquire values of the one or more physical quantity parameters of at least one of the first and at least second paths in an acquisition operation that includes switching on the first and at least second paths either simultaneously during at least part of the acquisition operation, or successively, and
perform the comparison using the values acquired in the acquisition operation.

In an embodiment, the monitoring module is configured, for each physical quantity parameter, to compute a difference or a ratio related to said physical quantity parameter, and compare the computed difference or ratio with a corresponding reference value, and
wherein the values used to compute the ratio or difference include two values respectively acquired for the first and at least second paths, or two values acquired for one selected path before and after switching off the other path(s).

The present disclosure also concerns a vehicle including the previously defined system.

BRIEF DESCRIPTION OF THE DRAWINGS

Other features, purposes and advantages of the disclosure will become more explicit by means of reading the detailed statement of the non-restrictive embodiments made with reference to the accompanying drawings.

DETAILED DESCRIPTION

The present disclosure concerns a system 100 for controlling power supply to a load 200 from a power supply line 300. The power supply line 300 may be connected to a power battery, or to a power distribution network. For example, the system 100 may be used in a vehicle to supply power to a load, such as an Electric Power Steering system, lights, a radio system, or any other system or element consuming electric power.

Figure 1:
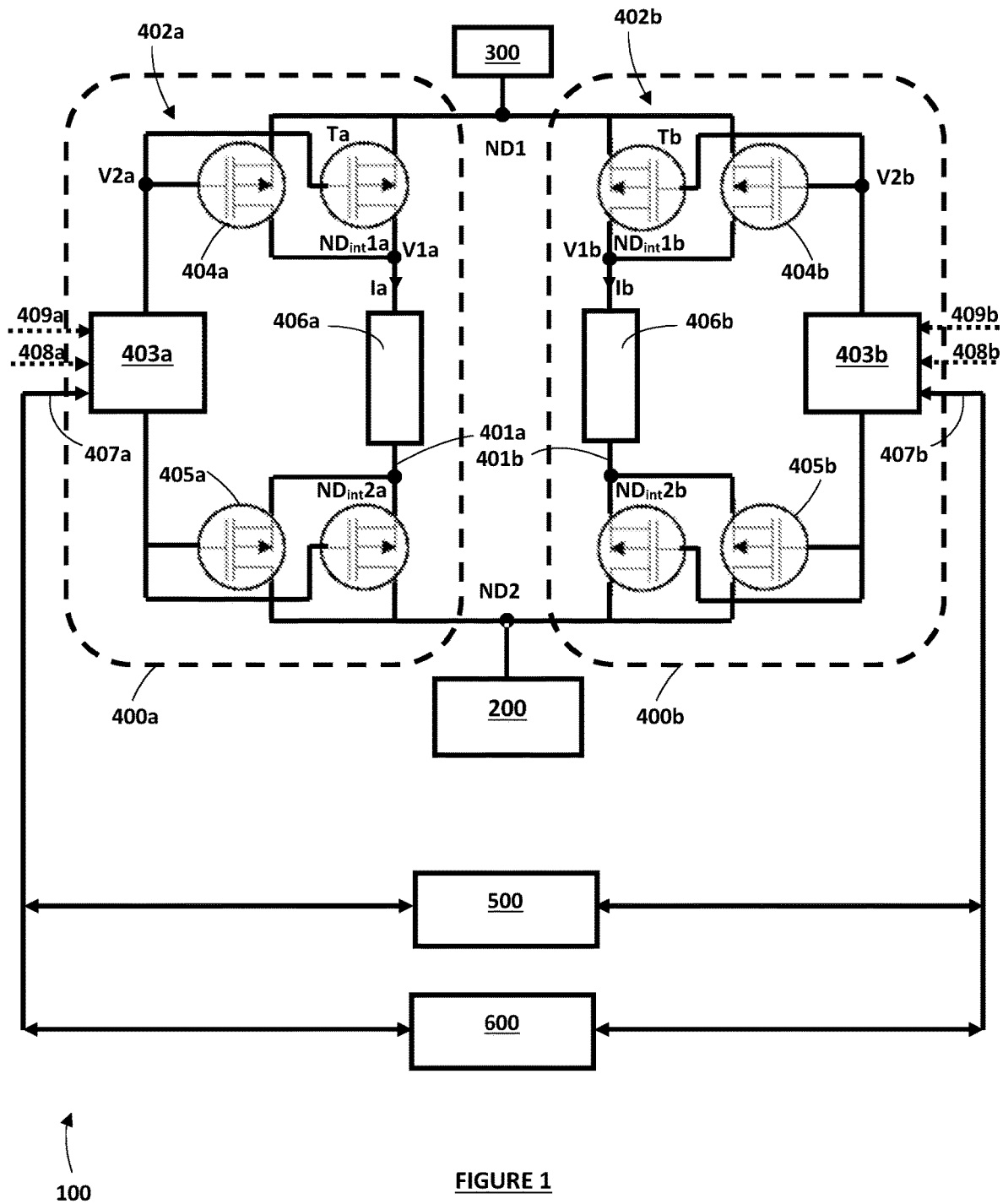
FIG. 1 shows a schematic diagram of a system for controlling power supply to a load from a power supply line, according to an embodiment.

In an embodiment, the system 100 comprises a first circuit 400a, at least a second circuit 400b, a control module 500 and a monitoring module 600. The expression "at least a second circuit" means that the system 100 may comprise one or more other circuits, in addition to the first and second circuits 400a, 400b, for example a third circuit 400c, a fourth circuit 400d, etc. Each additional circuit 400c, 400d, ... may be identical or similar to the second circuit 400b, and will not be described in more detail. FIG. 1 illustrates a particular embodiment of the system 100 including only two circuits: a first circuit 400a and a second circuit 400b.

The first circuit 400a comprises a first path 401a for supplying power to the load 200 through the first path 401a and a first switching mechanism 402a. The second circuit 400b comprises a second path 401b for supplying power to the load 200 through the second path 401b and a second switching mechanism 402b. By definition, a path for supplying power is the path through with the electric current flows from the power supply line to the load.

In an embodiment, the first and at least second circuits 400a, 400b may be connected in parallel between two nodes. The two nodes may include a power supply line node ND1 and a load connection node ND2. The power supply line node ND1 is connected to the power supply line 300. In a high-side configuration, as illustrated in FIG. 1, the power supply line node ND1 is a node where a positive supply potential, for example a battery potential $V_{bat}$ or a power distribution network potential, is available. Alternatively, in a low-side configuration, the power supply line node ND1 may be connected to the ground GND. The load connection node ND2 is connected to the load 200.

Figure 3:
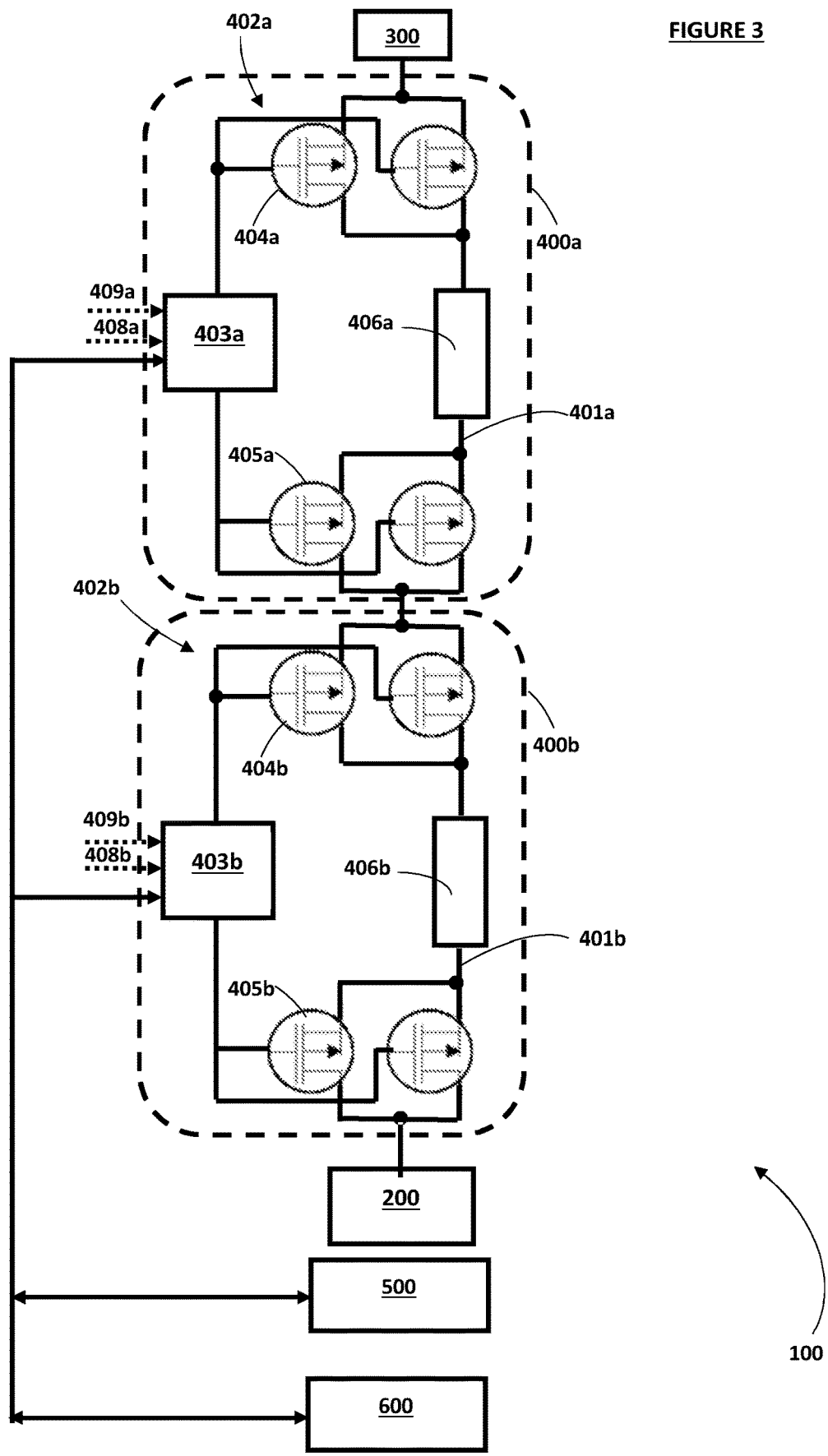
FIG. 3 shows a schematic diagram of a system for controlling power supply to a load from a power supply line, according to another embodiment.

Alternatively, the first and at least second paths 401a, 401b may be serially connected, as illustrated in FIG. 3.

Each of the first and at least second circuit 400a, 400b may be an integrated circuit, such as a chip, including components mounted on a printed circuit board. The first and at least second circuits 400a, 400b may be implemented on the same chip or on two separate chips. In an embodiment, the first and at least second circuit 400a, 400b may have the same or similar electric structures or configurations. However, the two circuits 400a, 400b may use components from different manufacturers. An embodiment of the first circuit 400a will be described below. The at least second circuit 400b may have the same electric structure and/or implement the same functions as the first circuit 400a, and will not be described in more details. In particular, the second switching mechanism 402b may be structurally the same as the first switching mechanism 402a.

In each of the first and at least second circuits 400a, 400b, the switching mechanism 402a, 402b is configured to switch, or turn, on or off the corresponding path 401a 401b for supplying power to the load 200. It includes one or more switches such as transistors, for example MOSFETs. In an embodiment, the switching mechanism 402a, 402b may have at least a first set of N1 transistors 404a, 404b, with N1≥1. Optionally, each switching mechanism 402a, 402b may further have a second set of N2 transistors 405a, 405b, with N2≥1. The numbers N1 and N2 may be identical or different. The numbers of transistors N1, N2 may be adapted to the amount of current in the circuits. Typically, the MOSFETs cannot handle too much current. So, the number of MOSFETs N1, N2 in each set should be more important for high currents, than for low currents. In the particular embodiment illustrated in FIG. 1, N1=2 and N2=2.

The N1 transistors 404a, 404b of the first set may be connected in parallel between the power supply line node ND1 and a first internal node $ND_{int}1a$, $ND_{int}1b$. The N2 transistors 405a, 405b of the second set may be connected in parallel between the load connection node ND2 and a second internal node NDint2a, NDint2b. In each of the first and at least second circuit 400a, 400b, the first internal node $ND_{int}1a$, or $ND_{int}1b$, and the second internal node $ND_{int}2a$, or $ND_{int}2b$, may be connected in series to each other. The second switching mechanism 402b may have the same configuration, or electric structure, as the first switching mechanism 402a, as illustrated in FIG. 1.

Each of the first and at least second circuits 400a, 400b may further comprise a driver 403a, 403b for controlling the operations of its switching mechanism 402a, 402b. The driver 403a, 403b may be implemented with hardware and software. In each circuit 400a, 400b, the driver 403a, 403b is connected to the switches, or transistors, 404a-405a, 404b-405b, and configured to transmit control signals to the switches to switch them on or off.

Optionally, in each of the first and at least second circuits 400a, 400b, the driver 403a, 403b may be configured to monitor an electric current Ia, Ib flowing through the path for power 401a, 401b, in cooperation with a current detection device. For example, the current detection device may include a shunt resistor 406a, or 406b, placed between the two internal nodes $ND_{int}1a$ and $ND_{int}2a$, or $ND_{int}1b$ and $ND_{int}2b$, and a circuit (not represented in FIG. 1) to measure the potential difference across the shunt resistor 406a, 406b. Any other type of current detection device may be used instead.

Optionally, in each of the first and at least second circuits 400a, 400b, the driver 403a, 403b may also be configured to perform a local diagnosis to detect a malfunction in the circuit 400a, 400b, as described later. The diagnosis may be performed using the electric current Ia, Ib detected in the path for power 401a, 401b.

The control module 500 of the system 100 is configured to output control signals to control operations of the first circuit 400a and the at least second circuit 400b to independently switch on or off the first and at least second paths 401a, 402b for supplying power to the load 200. The control module 500 may be connected to the drivers 403a, 403b of the first and at least second circuit 400a, 400b, via respective first control channels 407a, 407b. In operation, the control signals generated by the control module 500 are transmitted to the circuit drivers 403a, 403b, and then, in each of the first and at least second circuit 400a, 400b, the driver 403a, 403b outputs local control signals to independently switch on or off the switches 404a-405a, 404b-405b, so as to switch on or off the corresponding path for supplying power to the load 200

The control module 500 may be implemented with hardware and software. In an embodiment, it may include a processor, or micro-controller, and a memory storing a program executed by the processor.

The monitoring module 600 has the functions of monitoring one or more physical quantity parameters of the paths for power 401a, 401b of the first and at least second circuits 400a, 400b, and detecting, based on a comparison, deviations of values of the monitored one or more physical quantity parameter from respective reference values, so as to check the consistency between the first and at least second paths for power 401a, 401b. The detection of a lack of consistency between the first and at least second paths for power 401a, 401b may indicate or predict a potential degradation in one of the first and at least second paths for power 401a, 401b.

The monitoring module 600 may be implemented with hardware and software. It includes a processor, or micro-controller, and a memory storing a program for monitoring. The processor reads and executes the program, so that the monitoring function is implemented.

The control module 500 and the monitoring module 600 may be implemented with the same hardware and/or software. In particular, the control module 500 and the monitoring module 600 may be implemented on one single processor, or micro-controller.

Each of the first and at least second circuits 400a, 400b may include one or more detection devices configured to measure the one or more physical quantity parameters. The one or more physical quantity parameters may comprise parameters such as current, voltage, and/or temperature. For example, each of the first and at least second circuits 400a, 400b may include one or more of the following detection devices:

- a first potential detection device to measure a first potential V1a, V1b at an internal node, for example the node $ND_{int}1a$, $ND_{int}1b$;
- a second potential detection device to measure a second potential V2a, V2b at another internal node, for example a node of interconnection between the driver 403a, 403b and each switch of the set of switches 404a;
- a temperature detection device placed close to one or more switches or transistors, for example close to one of the transistors 404a, 404b, to detect the temperature of this transistor; and/or
- the current detection device to measure the current Ia, Ib flowing through the path for power 401a, 401b.

The above examples of monitored physical quantity parameters are only illustrative and non-limitative. In particular, other potentials, potential differences, temperatures and currents may be monitored in each circuit 400a, 400b.

The monitoring performed by the monitoring module 600 allows to detect, based on a comparison, deviations of values of the monitored one or more physical quantity parameters from respective reference values so as to check the consistency between the first and at least second paths, as described later in more details. The comparison may be performed, for each physical quantity parameter, using values of this physical quantity parameter of at least one of the paths 401a, 401b, acquired in an acquisition operation. In an embodiment, the acquisition operation may include switching on each of the first and at least second paths. The first and at least second paths may be switched on either simultaneously, during at least part of the acquisition operation, or successively.

For each circuit 400a, 400b, the values of the one or more physical quantity parameters are acquired by the detection devices and transmitted to the monitoring module 600 via the circuit drivers 403a, 403b.

The reference values used to detect deviations are representative of a normal and/or expected behavior of the first and at least second paths. A deviation of the monitored values of one physical quantity parameter for the first and/or at least second paths 401a, 401b from a corresponding reference value indicates a lack of consistency between the first path 401a and the second path 401b, which is indicative of a potential degradation in one of the first and at least second paths 401a, 401b. This allows to predict or detect a malfunction of one of the paths for supplying power 401a, 401b.

The monitoring module 600 may be configured, for each physical quantity parameter, to compute a difference or a ratio related to this physical quantity parameter, and compare the difference or ratio with a corresponding reference value, as explained later in more details.

A software may be provided to control the first and at least second switching mechanisms to switch on or off the first and at least second paths 401a, 401b in the acquisition operations. This software may be part of the monitoring module 600. For example, the monitoring module 600 transmits instructions to control the operations of the first and at least second circuits 400a, 400b in the acquisition operation to the control module 500, and then the control module transmits appropriate control signals to the drivers 403a, 403b.

Figure 2:
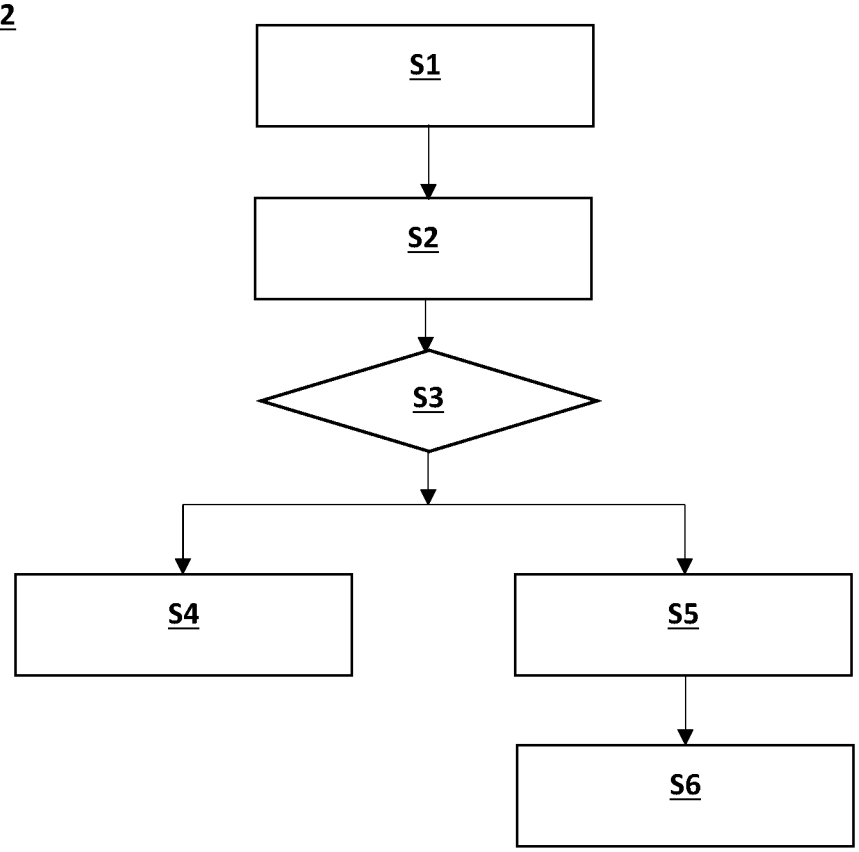
FIG. 2 shows a flowchart for explaining operations of monitoring one or more physical quantity parameters of a first and at least second paths for supplying power to the load, to detect or predict a degradation in a path, according to an embodiment.

FIG. 2 is a flowchart for explaining operations of monitoring one or more physical quantity parameters of the first and at least second paths 401a, 401b for supplying power to the load 200, to detect or predict a degradation in a path.

In operation, power is supplied to the load 200 from the power supply line 300 via the first and at least second circuits 400a, 400b, under control of the control module 500. For example, to supply power to the load 200, the first and at least second switching mechanisms 402a and 402b are controlled to be concomitantly switched on. As a result, the first and at least second paths for supplying power 401a, 401b are turned on, or switched on, at the same time. In that case, the current flowing through each path 401a, 401b is expected to be the same.

Alternatively, only one of the paths 401a, 401b may be switched on to supply power to the load 200. More generally, in case the system 100 has N circuits, only M circuit(s) with M<N may be switched on to supply power to the load 200.

The monitoring operations to monitor one or more physical quantity parameters of the first and at least second paths 401a, 401b includes an acquisition operation S1.

As previously described, in the acquisition operation S1, the first and at least second paths 401a, 401b may be switched on either simultaneously, during at least part of the acquisition operation S1, or successively. In each circuit 400a, 400b, the values of the one or more physical quantity parameters are acquired by detection devices and transmitted to the monitoring module 600 via the circuit drivers 403a, 403b. Different illustrative examples of the acquisition operation will be described later.

Then, in a step S2, the monitoring module performs a comparison, using the monitored values of the one or more physical quantity parameters acquired in the acquisition operation S1. In the step S2, for each physical quantity parameter, the monitoring module 600 may compute a difference or a ratio between acquired values of the physical quantity parameter. For example, the values used to compute the ratio or difference may be two values respectively acquired for the first and second path 401a, 401b, or two values acquired for one selected path 401a or 401b at two different times, for example before and after switching off the other path 401b or 401a, as will be described later.

In a next step S3, the monitoring module 600 compare the ratios or differences computed for the one or more physical quantity parameters to respective reference values to detect deviations of the monitored one or more physical quantity parameter values from the respective reference values, so as to check a consistency between the first and at least second path 401a, 401b. A certain range of tolerance $\Delta$ may be accepted. Thus, if the computed difference or ratio is within the range of tolerance $\Delta$ around the reference value, the consistency between the first and at least second path 401a, 401b is successfully checked, in a step S4. But, if the computed difference or ratio is out of the range of tolerance $\Delta$ around the reference value, the consistency between the first and at least second path 401a, 401b is denied, in a step S5. Such a lack of consistency between the first and at least second path 401a, 401b is indicative of a potential degradation in a path 401a or 401b. In a step S6, a warning message S6 is generated to inform a user of the potential degradation detected. Additionally or alternatively, other detections of malfunction may be performed under control of the monitoring device 600 to identify more precisely the potential degradation, if needed.

Different examples of the operations of acquisition, comparison and deviation detection are described below.

In a first example, the monitoring module 600 acquires the values of the one or more physical quantity parameters of the first path 401a and the values of the one or more physical quantity parameters of the at least second path 401b when the first and at least second paths 401a, 401b are concomitantly switched on. In this first example, it is expected that the first and at least second paths are identical so that the same current Ia, Ib is flowing through each of the first and at least second paths 401a, 401b. The values of each physical quantity parameter may be acquired at the same time in the first path 401a and in the second path 401b. Alternatively, they may be acquired not exactly at the same time, but at different times within a predetermined time interval. This time interval may be limited, for example less than a few minutes, to enable to check the consistency between the first and at least second path 401a, 401b under same circumstances.

Then, for each physical quantity parameter, the monitoring module 600 may compute the difference or ratio between the value acquired for the first path 401a and the value acquired for the second path 401b, or for any other path, and compare said difference or ratio to a reference value that is equal to 0 or 1 respectively. The list below provides illustrative and non-limitative examples of computations that the monitoring module 600 may perform using values of physical quantity parameters acquired according to the first example:

compute the difference, or ratio, between the voltage V1a in the first circuit 400a and the voltage V1b in the second circuit 400b, and compare the computed difference V1a−V1b, or ratio V1a/V1b, with the reference value 0, or 1, respectively;

compute the difference, or ratio, between the voltage V2a in the first circuit 400a and the voltage V2b in the second circuit 400b, and compare the computed difference V2a−V2b, or ratio V2a/V2b, with the reference value 0, or 1, respectively;

compute the difference, or ratio, between the temperature $T_a$ in the first circuit 400a and the temperature $T_b$ in the second circuit 400b, and compare the computed difference $T_a-T_b$, or ratio $T_a/T_b$, with the reference value 0, or 1, respectively.

A second example may include simultaneously switching on the first and at least second paths 401a, 401b, and then maintaining one selected path switched on while switching off the other(s) path(s). The monitoring module 600 may acquire values of the one or more physical quantity parameters related to the selected path, before and after switching off the other(s) path(s). Then, it may perform a comparison of the values acquired before and after the switching off of the other path(s). For example, for each physical quantity parameter, the monitoring module 600 may compute a difference or ratio between the values acquired for the selected path before and after switching off the other path(s) and compare said difference or ratio to an expected and predetermined reference value. The same acquisition operation and computations can be performed for each path.

Let's consider a particular embodiment of the system 100 comprising only two circuits: the first circuit 400a with the first path 401a for supplying power to the load 200, and the second circuit 400b with the second path 401b for supplying power to the load 200. According to the second example of the acquisition operation, the first path 401a and the second path 401b are first concomitantly switched on, and the monitoring module 600 acquires values of the one or more physical quantity parameters in one selected path, for example the first path 401a. It is assumed that, in such a configuration, the current flowing through each of the first and second paths 401a, 401b is the same. Then, the selected first path 401a is maintained switched on, while the second path 401b is switched off. The monitoring module 600 acquires values of the one or more physical quantity parameters of the selected path 401a that is maintained switched on. It is expected that, after switching off the second path 401b, the current flowing through the first path 401a, or the drop of voltage across the shunt resistor 406a, increases, and more precisely doubles.

The monitored temperature in the first path 401a is also expected to increase after switching off the second path 401b.

The same acquisition operation and computations can also be executed by selecting the second path 401b, instead of the first path 401a.

Then, the monitoring module 600 may perform computations using the values of the one or more physical quantity parameters related to the selected path 401a acquired before and after switching off the second path 401b, so as to check the consistency between the first and second paths 401a, 401b. In this way, it can be verified if the selected path 401a has a normal behavior based on a comparison of the monitored values acquired before and after switching off the second path 401b. The list below provides illustrative and non-limitative examples of computations that the monitoring module 600 may perform using values of physical quantity parameters of the first path 401a acquired according to the second example:

compute the ratio between the drops of voltage across the shunt resistor 406a before and after switching off the second path 401b, and compare the computed ratio ΔVa'/ΔVa with the reference value 2, where ΔVa' is the drop of voltage across the shunt resistor 406a when the path 401b is off and the path 401a is on and ΔVa is the drop of voltage across the shunt resistor 406a when the paths 401a and 401b are both on;

compute the ratio between the current flowing across the shunt resistor 406a before and after switching off the second path, and compare the computed ratio $I_a'/I_a$ with the reference value 2, where $I_a'$ is the current across the shunt resistor 406a when the path 401b is off and the path 401a is on and $I_a$ is the current across the shunt resistor 406a when the paths 401a and 401b are both on;

compute the difference, or ratio, between the temperatures measured in the first path 401a before and after switching off the second path 401b, and compare the computed difference $T_a'-T_a$, or ratio $T_a'/T_a$, with a reference value, where $T_a'$ is the temperature measured in the first path 401a, or close to the first path 401a, when the path 401b is off and the path 401a is on and $T_a$ is the temperature measured in the first path 401a when the paths 401a and 401b are both on; the reference value that may be predetermined experimentally, to detect an expected increase of the temperature.

A third example may include successively switching on the first and at least second paths 401a, 401b. In other words, each path is successively switched on, while switching off the other path(s). The monitoring module 600 may acquire values of the one or more physical quantity parameters related to each path 401a, 401 when it is switched on, and, then, perform a comparison between the values acquired for said path with the values acquired for another path. It is expected that, in such a configuration, the same current is flowing through each of the first and second path 401a, 401b, when said path is switched on. The comparison may include, for each physical quantity parameter, computing the difference or ratio between the value acquired for the first path and the value acquired for the second path, or any other path, and compare said difference or ratio to a reference value that is equal to 0 or 1 respectively.

Let's consider the particular and illustrative embodiment of the system 100 comprising only two circuits: the first circuit 400a with the first path 401a for supplying power to the load, and the second circuit 400b with the second path 401b for supplying power to the load 200.

The list below provides illustrative and non-limitative examples of computations that the monitoring module 600 may perform using the values of the one or more physical quantity parameters of the first and second path 401a, 401b acquired according to the third example:

compute the difference, or ratio, between the voltage V1a in the first circuit 400a and the voltage V1b in the second circuit 400b, respectively acquired when the first path 401a is switched and when the second path 401b is switched on, and compare the computed difference V1a−V1b, or ratio V1a/V1b, with the reference value 0, or 1, respectively;

compute the difference, or ratio, between the voltage V2a in the first circuit 400a and the voltage V2b in the second circuit 400b, respectively acquired when the first path 401a is switched and when the second path 401b is switched on, and compare the computed difference V2a−V2b, or ratio V2a/V2b, with the reference value 0, or 1, respectively;

compute the difference, or ratio, between the temperature $T_a$ in the first circuit 400a and the temperature $T_b$ in the second circuit 400b, respectively acquired when the first path 401a is switched and when the second path 401b is switched on, and compare the computed difference $T_a-T_b$, or ratio $T_a/T_b$, with the reference value 0, or 1, respectively.

The above-described examples of acquisition operation to acquire values of the one or more physical quantity parameters of the first and at least second paths 401a, 401b are only illustrative examples. Any other acquisition operation could be implemented to acquire values of the one or more physical quantity parameters of the first and at least second paths 401a, 401b, in order to detect, based on a comparison, deviations of values of the monitored one or more physical quantity parameter values from respective reference values, so as to check the consistency between the first and at least second path 401a, 401b. The first and at least second paths 401a, 401b are consistent with each other when they behave in a consistent manner with each other, in other words when they have respective behaviors that do not deviate from each other.

Each driver 403a, 403b of the first and at least second circuits 400a, 400b may be further connected to:

a second control channel 408a, 408b exclusively provided with logical hardware elements and configured to control the operations of the first circuit and second circuit so as to switch on or off the first path and the second path when the first control channel 407a, 407b is not working; and/or a third control channel 409a, 409b connected to a power battery, configured to supply power to the circuit 400a, 400b, when the first control channel 407a, 407b and the second control channel 408a, 408b are not working.

Optionally, the monitoring module 600 may be further configured to detect malfunctions and/or degradations in each of the first or at least second paths 401a, 401b, by acquiring values of the one or more physical quantity parameters of said path and processing the acquired values, without relying on a comparison to detect a deviation from a reference value and check the consistency between the first and at least second paths.

In a first example, a malfunction can be that one component is broken and/or disconnected, which results in that the current cannot flow. In that case, if the path including the broken and/or disconnected component is controlled to be switched on, the current does not flow. In other words, the value of measured current is zero. The monitoring module 600 may detect the malfunction based on the monitored current.

In a second example, a malfunction can be that a transistor, such as a MOSFET, of one of the paths 401a, 401b is broken in such a way that it is conducting all the time. So, even if the path 401a, 401b is switched off, the current flows through the body diode of the MOSFET and a current that is not zero can be measured.

In a third example, a malfunction can be that a transistor such as a MOSFET of one of the paths 401a, 401b has a broken gate so that the activation of the MOSFET cannot be controlled. In such a case, the broken MOSFET cannot be switched or turned on and all the current flows through the one or more other MOSFET connected in parallel. As a result, the temperature of the other MOSFET(s) conducting the current increases, which can be detected by monitoring this temperature.

The invention claimed is:

1. A system for controlling power supply to a load from a power supply line, the system comprising:
   a first circuit comprising a first path for supplying power to the load and a first switching mechanism for controlling the supply of power through the first path;
   at least one second circuit comprising a second path for supplying power to the load and a second switching mechanism for controlling the supply of power through the second path,
   wherein the first circuit and the at least one second circuit are connected in parallel between a load connection node (ND2) and a power supply line node (ND1),
   wherein each of the first and second switching mechanisms includes a first set of N1 transistors connected in parallel between the power supply line node (ND1) and a first internal node (NDint1a, NDint1b), with N1>1, and a second set of N2 transistors connected in parallel between the load connection node (ND2) and a second internal node (NDint2a, NDint2b), wherein the first internal node and the second internal node are connected in series to each other, and
   wherein the first internal node and the second internal node are connected to each other through a current detection device;
   a control module configured to output control signals to control operations of the first circuit and the at least one second circuit so as to independently switch on or off each of the first and second paths; and
   a monitoring module configured to monitor one or more physical quantity parameters of the first and second paths,
   wherein the monitoring module is configured to detect, based on a comparison, deviations of values of the monitored one or more physical quantity parameters from respective reference values, so as to check a consistency between the first and second paths.

2. The system according to claim 1, wherein the first circuit and the at least one second circuit have a same electric structure.

3. The system according to claim 1, wherein:
   each of the first circuit and the at least one second circuit includes one or more detection devices configured to measure the one or more physical quantity parameters, and
   the one or more physical quantity parameters are from a group including current, voltage, and temperature.

4. The system according to claim 1, wherein the monitoring module is configured to:
   acquire the values of the one or more physical quantity parameters of at least one of the first and second paths in an acquisition operation that includes switching on the first and second paths either simultaneously during at least part of the acquisition operation, or successively, and
   perform the comparison using the values of the one or more physical quantity parameters of at least one of the first and second paths.

5. The system according to claim 4,
   wherein the monitoring module is configured, for each physical quantity parameter, to compute a difference or a ratio related to said physical quantity parameter, and compare the computed difference or ratio with a corresponding reference value, and
   wherein a plurality of values used to compute the ratio or difference include two values respectively acquired for the first and second paths, or two values acquired for one selected path before and after switching off the other path.

6. The system according to claim 4, wherein the monitoring module is configured to:
   acquire the values of the one or more physical quantity parameters of the first path and values of the one or more physical quantity parameters of the second path, when the first and second paths are simultaneously switched on; and
   for each physical quantity parameter, compute a difference or ratio between the value acquired for the first path and the value acquired for the second path and compare said difference or ratio to a reference value to detect a deviation.

7. The system according to claim 4, wherein, the first and second paths being successively switched on in the acquisition operation, the monitoring module is configured to
   acquire the values of the one or more physical quantity parameters of the first path when the first path is switched on;
   acquire the values of the one or more physical quantity parameters of the second path, when said second path is switched on; and
   for each physical quantity parameter, compute a difference or ratio between the value acquired for the first path and the value acquired for the second path and compare said difference or ratio to a reference value to detect a deviation.

8. The system according to claim 4, wherein the monitoring module is configured to:
   acquire the values of the one or more physical quantity parameters for one selected path of the first and second paths, when said first and second paths are simultaneously switched on;
   maintain the selected path switched on, while switching off the other path, and acquire values of the one or more physical quantity parameters for the selected path;
   for each physical quantity parameter, compute a difference or ratio between the values acquired for the selected path before and after switching off the other path and compare said difference or ratio to a reference value, to detect a deviation.

9. The system according to claim 4, wherein the monitoring module includes software for controlling operations of the first and the second switching mechanisms to switch on or off the first and second paths in the acquisition operation.

10. The system according to claim 1, wherein each of the first circuit and the at least one second circuit includes a driver that controls the corresponding switching mechanism.

11. A vehicle including the system according to claim 1.

* * * * *